US009376311B2

(12) United States Patent
Rahmanian et al.

(10) Patent No.: US 9,376,311 B2
(45) Date of Patent: Jun. 28, 2016

(54) METHOD FOR FABRICATING THERMOPLASTIC FLUIDIC DEVICES BY OROGENIC GROWTH AND FLUIDIC DEVICES MANUFACTURED THEREBY

(71) Applicant: The University of Maryland, College Park, College Park, MD (US)

(72) Inventors: Omid Rahmanian, Washington, DC (US); Chien-Fu Chen, Kaohsiung (TW); Donald Lad Devoe, Bethesda, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 73 days.

(21) Appl. No.: 14/109,711

(22) Filed: Dec. 17, 2013

(65) Prior Publication Data

US 2015/0368098 A1    Dec. 24, 2015

Related U.S. Application Data

(60) Provisional application No. 61/738,255, filed on Dec. 17, 2012, provisional application No. 61/758,823, filed on Jan. 31, 2013.

(51) Int. Cl.
*B81C 1/00* (2006.01)
*B82Y 40/00* (2011.01)
*B81C 3/00* (2006.01)

(52) U.S. Cl.
CPC ....... *B81C 1/00119* (2013.01); *B81B 2201/058* (2013.01); *B81C 3/001* (2013.01); *B81C 2203/032* (2013.01); *B82Y 40/00* (2013.01); *Y10T 428/24331* (2015.01)

(58) Field of Classification Search
CPC ........................ B01L 3/502707; B81C 3/001
USPC ............................................... 156/308.6, 83
See application file for complete search history.

(56) References Cited

U.S. PATENT DOCUMENTS

| | | | | |
|---|---|---|---|---|
| 4,128,522 A * | 12/1978 | Elam | ........................ | C23C 4/005 106/1.25 |
| 4,494,285 A * | 1/1985 | O'Boyle | ................. | B29D 22/00 156/245 |
| 6,632,318 B1 * | 10/2003 | Ding | ........................ | C08L 23/04 156/308.6 |
| 7,390,377 B1 * | 6/2008 | Wallow | ..................... | C08J 5/121 156/183 |
| 2005/0217741 A1 * | 10/2005 | Bohm | ........................ | G05D 7/06 137/828 |
| 2009/0281250 A1 * | 11/2009 | DeSimone | ............. | C08G 59/30 525/418 |
| 2013/0133760 A1 * | 5/2013 | Bunner | .................. | G01N 30/32 137/488 |

* cited by examiner

*Primary Examiner* — Scott W Dodds
(74) *Attorney, Agent, or Firm* — Arent Fox LLP (57) ABSTRACT

A new process enabling rapid and efficient desktop manufacturing of microfluidic devices fabricated from thermoplastic substrates utilizing the selective irreversible swelling of thermoplastic polymer when exposed to suitable solvent makes it possible to produce micro- or nano-fluidic devices with outstanding bonding and collapse free micro- or nano-structures.

21 Claims, 4 Drawing Sheets

METHOD FOR FABRICATING THERMOPLASTIC FLUIDIC DEVICES BY OROGENIC GROWTH AND FLUIDIC DEVICES MANUFACTURED THEREBY

CROSS-REFERENCE TO RELATED APPLICATION

This Application claims the benefit from the Provisional Applications of U.S. Patent Application No. 61/738,255, filed Dec. 17, 2012; and U.S. Patent Application No. 61/758,823, filed Jan. 31, 2013, the disclosure of each of which is hereby incorporated in its entirety by reference.

GOVERNMENT SUPPORT

This invention was made with government support under R21EB011750 awarded by NIH, R21EB009485 awarded by NIH, and N660011014 awarded DARPA. The government has certain rights in the invention.

This application also incorporates articles of O. Rahmanian, C. -F. Chen, D. L. DeVoe, "Microscale Patterning of Thermoplastic Polymer Surfaces by Selective Solvent Swelling," *Langmuir*, vol. 28, pp. 12923-12929, 2012, which was published on Aug. 23, 2012; and O. Rahmanian, D. L. DeVoe, "Pen Microfluidics: Rapid Desktop Manufacturing of Sealed Thermoplastic Microchannels," Lab on a Chip, vol. 13, pp. 1102-1108, 2013, which was published on Jan. 7, 2013 in their entirety by reference.

FIELD OF THE INVENTION

The present invention relates to a method which enables the fabrication of micro- or nano-fluidic channels and related microscale or nanoscale features in thermoplastic materials with or without the need for a mold or photolithography as commonly practiced. The present invention also provides a device comprising at least a channel with a channel wall that is collapse-free, which is not achievable by the conventional manufacturing methods.

BACKGROUND OF THE INVENTION

There has been a long demand for simple and rapid desktop manufacturing processes capable of decreasing the cost, time, and labor associated with micro- or nano-fluidic system fabrication in device prototyping and low volume production.

Due to the relative ease and speed of fabrication afforded by the soft lithography technique with polydimethylsiloxane (PDMS) elastomer, PDMS has been widely used in device prototyping of microfluidic applications. However, PDMS suffers from a number of disadvantages such as low stiffness, high gas permeability, high water absorption, and incompatibility with many common solvents used in biomolecular assays. More fundamentally, although within certain constraints a PDMS chip may be prototyped from design to final sealed device within several days, elastomer micromolding processes remain far from meeting the goals of true desktop manufacturing, with the microfabrication of templates needed for PDMS molding often requiring significant infrastructure, time, and labor.

Thermoplastic polymers are attractive materials for the fabrication of a variety of micro- or nano-systems, with applications including micro- or nano-optical components, microcantilever chemical sensors, micro- or nano-structured biomimetic surfaces, and micro- or nano-fluidic chips. Unlike elastomers such as PDMS, thermoplastic polymers offer a combination of excellent dimensional stability, good optical properties, low water absorption and gas permeability, low cost, and a range of bulk and surface properties. Thermoplastic micro- or nano-fabrication has been widely explored using conventional replication methods, for example, hot or colds embossing, injection molding, hot roller microprinting and thermoforming, as well as serial fabrication methods such as direct laser machining and micromilling. While these techniques provide advantages in some aspects, they all require significant infrastructure investment, time, and effort. Still more, all these conventional methods involve material removal or displacement through thermal or mechanical means. When device features are miniaturized to micro- or nano-scales, thermal or mechanical means of machining or patterning place a challenge on the mechanical properties of the structural materials for the device. It is generally difficult to control the drill bits or heating temperature so that features of micrometer or even nanometer scale are produced with high replicability and less deformation.

The orogenic fabrication methods disclosed in the current invention are simple and rapid desktop manufacturing processes capable of decreasing the cost, time, and labor associated with thermoplastic micro- or nanon-fluidic system fabrication. Based on the irreversible swelling of thermoplastic polymer upon exposure to a suitable solvent, one advantage of the current invention is that it can be carried out with or without lithography or micromolding. Another advantage of the current invention is that bonding of substrate can be achieved at room temperature and low pressure. The current invention provides a quick, economic and highly controllable means to achieve low volume production or prototyping of micro- or nano-fluidic device.

SUMMARY OF THE INVENTION

The present invention provides a new process enabling rapid desktop manufacturing of sealed microfluidic chips fabricated from preferably homogeneous thermoplastic substrates.

A first aspect of the current invention provides a method for manufacturing devices, comprising: masking a first substrate comprising a thermoplastic polymer; exposing the masked first substrate to a solvent so that the thermoplastic polymer exposed to the solvent swells and grows in height; and bonding the first substrate with a second substrate.

A second aspect of the current invention provides a method for manufacturing devices, comprising: masking a substrate comprising a thermoplastic polymer; and exposing the masked substrate to a solvent so that the thermoplastic polymer exposed to the solvent swells and grows in height; wherein the masking step comprises probe deposition of a protective composition.

A third aspect of the current invention provides a device comprising at least a channel, manufactured with a method comprising: masking a first substrate of thermoplastic polymer with a masking method; exposing the masked first substrate to a solvent so that the thermoplastic polymer exposed to the solvent swells and grows in height, forming walls of the channel; and bonding the first substrate with a second substrate; wherein the bonding step comprises solvent bonding; and wherein a height of the channel wall is more than 1 nm but no more than 500 μm.

DETAILED DESCRIPTION OF THE PREFERRED EMBODIMENTS

This invention provides an entirely different approach to forming micro- or nano-scale features in thermoplastic polymers termed orogenic micro-fabrication, wherein selected exposed regions of a substrate are raised from the substrate through an irreversible solvent swelling mechanism, and masked regions of the substrate preferably remains with the same volume, thus forming three-dimensional features. The term orogenic ("mountain forming") is used to differentiate the process from conventional thermoplastic micro- or nano-fabrication methods based on material removal or displacement rather than surface growth. The orogenic process comprises selective exposure of a substrate comprising a thermoplastic polymer to a suitable organic solvent, resulting in controlled and irreversible swelling of the exposed regions. Without limiting the current invention, the underlying mechanism for the irreversible swelling may be that as the polymer expands due to solvent uptake, mobile polymer chains rearrange within the polymer matrix, resulting in permanent volume change within the plasticized regions even after the solvent has been fully removed from the bulk polymer. Unlike the conventional solvent-assisted microcontact molding, a version of soft lithography in which solvent exposure is used to soften a thermoplastic substrate to enable replica molding from an elastomer template, and capillary imprint lithography, which employs thermally induced capillary flow to reshape a polymer surface using a mold, orogenic microfabrication involves masked surface growth to achieve the desired features.

The first aspect of the current invention provides a method for manufacturing devices, comprising: masking a first substrate comprising a thermoplastic polymer; exposing the masked first substrate to a solvent so that the thermoplastic polymer exposed to the solvent swells and grows in height; and bonding the first substrate with a second substrate.

The first aspect of this invention enables the realization of fully-sealed micro- or nano-channels in around one hour while requiring only minimal infrastructure. By taking advantage of a solvent swelling mechanism, this method allows raised features to be patterned on the surface of the substrate. Masking of the microfluidic features may be achieved with or without photolithography. The channels are then sealed through solvent bonding of the micro- or nano-channel chip to a second substrate, which may preferably comprise the same thermoplastic material as the patterned substrate.

A first substrate comprising a thermoplastic polymer includes, but is not limited to, substrate completely made of thermoplastic polymer and substrate made of materials other than thermoplastic polymer, such as glass, silicon, metal and non-thermoplastic polymers, with a layer of thermoplastic completely or partially coated on at least one side of the substrate.

When preparing the substrate for the method of the current invention, the substrate may be optionally diced into the desired size. The geometry and dimensions of the diced chips are not particularly limited.

The substrate may then be optionally subject to various cleaning procedures. The cleaning procedure is not particularly limited, so long as the cleaning method does not interfere with the reactivity of the thermoplastic polymer with the solvent. A cleaning method does not interfere with the reactivity of the thermoplastic polymer with the solvent if it does not promote or reduce the chemical or physical change of the thermoplastic polymer when it is exposed to the solvent.

Without limiting the current invention, one example of the cleaning methods for preparing the substrate is: cleaning a cyclic olefin copolymer (hereinafter "COC") substrate with methanol, isopropanol, and de-ionized water sequentially, followed by $N_2$ drying and overnight degassing at 75° C. under vacuum. The cleaning method may optionally have a sonication step at any stage of the cleaning process.

A suitable pair of thermoplastic polymer and solvent may be selected based at least on, among many other factors, solubility parameters known as the "Hildebrandt parameter" ("Hildebrandt parameters" hereinafter) of the thermoplastic polymer and the solvent. For amorphous non-polar thermoplastics, a chemical typically acts as a good solvent for the polymer when the cohesive energy densities for each molecular system are nearly equal. The Hildebrandt parameter, defined as the square root of the cohesive energy density, may be used as one of the suitable metrics for selecting an appropriate solvent for the orogenic process.

The current invention is not limited to any particular combination of thermoplastic polymer and solvent. Any thermoplastic polymer that may undergo an irreversible swelling due to exposure to a solvent can be utilized in the orogenic micro- or nano-fabrication. According to one embodiment of the current invention, the solvent preferably has a Hildebrandt parameter that differs from a Hildebrandt parameter of the thermoplastic by more than 1% and no more than 8%. The difference in Hildebrandt parameters is preferably more than 1% because when the thermoplastic polymer and the solvent have Hildebrandt parameters that are too close in value, the rate of the solvent infiltrating into the thermoplastic polymer is too high that it becomes difficult to control the growing rate. The difference in Hildebrandt parameters is preferably no more than 8% because when the thermoplastic polymer and the solvent have Hildebrandt parameters that are too different in value, the thermoplastic polymer becomes resistant to the solvent, leading to no swelling. According to one embodiment of the current invention, it is more preferable that the solvent has a Hildebrandt parameter which differs from a Hildebrandt parameter of the thermoplastic by more than 4% and no more than 6%. An example for a suitable combination of thermoplastic polymer and solvent, without limiting the current invention, may be the pair of cyclic olefin copolymer ("COC" hereinafter) and cyclohexane.

According to one embodiment of the current invention, the thermoplastic polymer is preferably a COC. COCs are attractive materials for microfluidic applications due to a range of favorable properties, including high optical clarity and low autofluorescence. In comparison with PDMS as an alternative material for rapid prototyping of microchannels, COC offers important advantages such as exceptionally dimensional stability, low water absorption, low gas permeability, and good chemical compatibility with a wide is range of alcohols, acids, and bases.

The COC in this invention is not particularly limited. Any cyclic olefin copolymer or cyclic olefin polymer responding to an exposure to a solvent by irreversible swelling can be used in the orogenic process.

The cyclic olefin copolymer comprises a product of chain copolymerization of one or more cyclic hydrocarbon monomers with an alkene.

The cyclic hydrocarbon monomer may have 3-25 carbon atoms. The cyclic hydrocarbon monomer may have one or more rings. The cyclic hydrocarbon monomer may contain one or more side chains, and may also contain no side chains. According to one embodiment of the current invention, the cyclic hydrocarbon monomer used in the chain copolymerization with alkene is preferably at least one of norbornene or tetracyclododecane.

The cyclic hydrocarbon monomers may copolymerize through a connecting alkene to form a copolymer. The alkene connector may have 2-12 carbon atoms, and may have a branched or a straight chain structure. According to one embodiment of the first aspect of the current invention, the COC may be a product of a chain copolymerization of a cyclic hydrocarbon monomer with ethene.

The solvent in the current invention is not particularly limited. Any solvent that may cause irreversible swelling of a thermoplastic polymer may be used in the orogenic process. According to still another embodiment of the current invention, the solvent is preferably cyclohexane. Without limiting the current invention, cyclohexane may be selected as a suitable organic solvent with a Hildebrandt parameter that differs from that of COC by 6%. By choosing a solvent/polymer system with a difference of more than 1% in Hildebrandt parameters, the solvent permeation process can be controllably halted to produce a swollen but stable matrix, without excessive solvation that could otherwise result in complete dissolution and lateral flow of the polymer surface. By choosing a solvent/polymer system with a difference of no more than 8% in Hildebrandt parameters, the solvent permeation process happen at a reasonably fast rate.

"Masking" refers to any methods that transfer a pattern to a substrate, such that selected areas on the substrate are protected from subsequent physical or chemical modification while the non-protected areas are subject to the aforementioned modification.

The masking step in the current invention is not particularly limited. Any method that transfers any patterns to the substrate under control, regardless of the resulting resolution, the dimension of the transferred pattern, and the complexity of the masking method, can be used in the orogenic process, as long as that selected regions of thermoplastic polymer are protected from the solvent, and other regions are not protected from the solvent. According to another embodiment of the current invention, the masking method is preferably at least one method selected from the group consisting of photolithography, UV/$O_3$ masking, contact printing, inkjet printing and probe deposition of protective compound.

"Photolithography" is a process used in microfabrication to pattern parts of a thin film or the bulk of a substrate. It uses light to transfer a geometric pattern from a photomask to a light-sensitive chemical "photoresist", or simply "resist," on the substrate. A series of chemical treatments then either engraves the exposure pattern into, or enables deposition of a new material in the desired pattern upon, the material not covered by the photo resist.

The photolithography method employed in the current invention is not limited to any particular processes or photoresist compositions. The photolithography processes may include, but are not limited to, optical lithography, UV lithography, EUV lithography, e-beam lithography, X-ray lithography, interference lithography or holographic lithography. The resist utilized in the lithography may include, but are not limited to, positive tone or negative tone resists.

"UV/$O_3$ masking" is also known as "UV/$O_3$ passivation." Exposure of a thermoplastic surface to a combination of UV light and ozone (UV/$O_3$) generates polar oxygen-containing surface groups that effectively resist the absorption of non-polar solvents into the polymer matrix. UV/$O_3$ masking generally follows a preceding photolithographic or non-photolithographic masking step. UV/$O_3$ masking may results in a reduction in pattern linewidths compared with the initially masked dimensions.

"Contact printing" in the current invention is not particularly limited. Any methods that transfer patterns to the substrate by contacting a pre-fabricated mold may be used. The contacting printing methods may include, but are not limited to, microcontact printing with a PDMS stamp to form patterns of ink on the surface of a substrate through conformal contact.

The ink used in the contact printing method is not particularly limited, so long as it adheres to the thermoplastic polymer surface and protects the underlying thermoplastic polymer from the solvent. The inks utilized in the contact printing method include, but are not limited to, compounds that contain at least one of a hydrophobic group or a hydrophilic group. Without limiting the current invention, in one embodiment of the current invention the ink is preferably glycol.

The "inkjet printing" is not particularly limited. Any process involving depositing droplets of ink onto a substrate so that a pattern is transferred to the substrate can be used. Without limiting the current invention, the inkjet may be a standard printing technology employing thermal or piezoelectric fluid actuation for deposition of a removable masking layer, consisting of dye or pigment components within an ink, to enable patterned orogenic growth of the deposition substrate.

The "probe deposition of a protective composition" is not particularly limited in the current invention. Any process of transferring a pattern to a substrate by contacting the substrate with a probe and moving the probe on the substrate so that the pattern is drawn with a protective composition may be utilized. It can be of any geometric shapes. Without limiting the current invention, the probe may preferably be a syringe needle shape with a slant end, a ball shape end, or a flat end perpendicular to its length direction. The dimension of the probe is not particularly limited. The probe can be of any size based on the masking resolution requirement. According to one embodiment of the current invention, the probe may preferably have a diameter of 20-1000 μm. According to another embodiment of the current invention, the probe may more preferably have a diameter of 30-200 μm.

The method of drawing the pattern with the probe is not particularly limited. Without limiting the current invention, suitable method may be chosen based on actual requirement of precision for the application. According to one embodiment of the current application, manual drawing with a pen nib may be preferably chosen for the benefit of low cost, flexibility and requiring less preparation, but at a cost of reduced precision and repeatability. According to another embodiment of the current application, automated robotic controlled pen nib may be preferably chosen for its precision and repeatability.

The protective composition used in the probe deposition method is not particularly limited, so long as the composition provides protection for the underlying thermoplastic material against the solvent. The protective composition may be hydrophobic or hydrophilic, depending on the substrate material. According to one embodiment of the current invention, since thermoplastics are moderately hydrophobic, composition based on less polar organic solvents are preferably chosen to prevent beading of liquid on the thermoplastic material surface. The organic solvent for the protective composition is not particularly limited. Some non-limiting examples comprise propylene glycol, propyl alcohol, toluene and glycol-ethers.

According to one embodiment of the current invention, colloidal ink systems of insoluble pigments or soluble dyes dispersed in an aqueous or organic solvent may be used as the protective composition. Without limiting the current invention to any particular composition, pigment or dyes in the ink composition may include, but are not limited to, one or more of eosin (red), copper phthalocyanine or triphenylmethane (blue), titanium dioxide (white), and carbon black (black).

Solvation refers to the process of exposing the thermoplastic polymer to a suitable solvent to achieve the "selective swelling."

The methods of solvation are not limited to the methods described hereafter. Any methods that expose the thermoplastic polymer to a suitable solvent may be employed.

Without limiting the current invention to any particular solvation method, in one embodiment of the current invention, the solvation step is preferably a vapor exposure method. According to this non-limiting embodiment, a masked substrate is securely positioned at the top of a sealed glass dish partially filled with cyclohexane, with the chip surfaces 2-8 cm, more preferably 4-6 cm, and even more preferably 5 cm from the liquid solvent. The cyclohexane is preferably heated to 25-35° C., more preferably 28-32° C., and even more preferably 30° C., in an enclosed oven to uniformly heat the entire assembly in order to reduce condensation of liquid solvent. The heated cyclohexane preferably generates an equilibrium vapor pressure of 10-18 kPa, more preferably 12-16 kPa, and even more preferably 14 kPa. After timed solvent exposure, the chip is promptly removed from the vapor exposure and dried under a stream of $N_2$ to encourage removal of residual solvent from the bulk polymer.

Bonding is a step of adding a second substrate to the first substrate. The bonding method in the current invention is not particularly limited. The bonding methods used in the orogenic process may include, but are not limited to, adhesive bonding, thermal fusion bonding, solvent bonding, localized welding and a combination thereof.

"Adhesive bonding" is to utilizing an adhesive agent to hold the first substrate and the second substrate together. In the current invention, adhesive bonding is not particularly limited to any process or any adhesive agent.

"Thermal fusion bonding" involves heating substrates to a temperature near or above the glass transition temperature Tg of one or both of the substrate materials, while applying a pressure to increase mating contact forces, so that the combined temperature and pressure can generate sufficient flow of polymer at the interface to achieve intimate contact, with interdiffusion of polymer chains between the surfaces leading to a strong bond. The thermal fusion method in the current invention is not limited to any particular process. Any thermo fusion process that utilizes heating and pressurizing on at least one of the substrates to achieve interface bonding between the first substrate and the second substrate may be used with the orogenic process.

"Localized welding" involves the introduction of a heating energy to induce softening in the proximity of the bonding interface. In the current invention, localized welding is not limited to any particular process. Any heating energy that causes softening in the proximity of the bonding interface may be used. Without limiting the current invention to any particularly localized welding method, an ultrasonic energy may be preferably used as the heating energy in a localized welding process.

"Solvent bonding" of thermoplastics takes advantage of polymer solubility in selected solvent systems to achieve entanglement of polymer chains across the interface. When a thermoplastic surface is solvated, polymer chains become mobile and can readily diffuse across the solvated layer, leading to extensive intertwining of chains between the surfaces and resulting in exceptionally strong bonds.

Without limiting the current invention to any particular bonding method, according to one embodiment of the current invention, the bonding method is preferably solvent bonding. According to yet another embodiment of the first aspect of the current invention, the bonding method is carried out at room temperature. According to still another embodiment of the first aspect of the current invention, the bonding method is carried out at a pressure not more than 500 psi. Since solvation process does not require high temperature and high pressure conditions, it is possible to carry out the solvent bonding under room temperature and reduced pressure to prevent collapse of channel walls, which is commonly seen with other bonding methods requiring higher temperature and higher pressure during the bonding step. Further, the resulting bonding strength from the solvent bonding is excellent, possibly due to the extensive intertwining of chains between the bonding surfaces.

Without limiting the current invention, the orogenic process of the current invention is particularly suitable for micro- or nano-fluidic applications that require a bonding step. Regardless of the solvent exposure time and masking method, the final sealing interface resulting from the orogenic growth is highly planar, which leads to good sealing during the bonding step.

The material of the second substrate to be bonded with the patterned first substrate is not particularly limited. Any materials suitable for serving as a second substrate may be used, which include, but are not limited to glass, silicon, metal and plastic materials. It is important to choose proper bonding method based on the material of the substrates to be bonded.

Without limiting the current invention, any post-orogenic growth treatment to the first substrate may be optionally carried out to achieve desired bonding surface property prior to the bonding step. Non-limiting examples of post-orogenic treatment include, but are not limited to, organic solvent rinse, de-ionized water rinse, plasma exposure, chemical/mechanical polishing and combinations thereof. According to one embodiment of the current invention, the first and the second substrates are preferably bonded together without any post-orogenic growth treatment on the bonding interface.

According to one embodiment of the current invention, the second substrate comprises a thermoplastic polymer with a Hildebrandt parameter that differs from a Hildebrandt parameter of the solvent by more than 4% and no more than 6%. As discussed earlier, when the difference in Hildebrandt parameters is 4-6%, the solvation phenomenon happens with the second thermoplastic material in the same way as with the first thermoplastic material. When solvated, mobile bonds are rearranged between the interfaces of the first and the second substrates, forming a strong bonding. Accordingly, excellent bonding strength may be achieved by solvent bonding using a second thermoplastic material with a Hildebrandt parameter that differs from the Hildebrandt parameter of the solvent by more than 4% and no more than 6%.

In yet another preferred embodiment of the current invention, the second substrate may comprise the same thermoplastic polymer as the first substrate. Unexpectedly, extra channel height may be achieved by bonding the second substrate of the same thermoplastic material as the first substrate immediately after the orogenic growth on the first substrate. This phenomenon has been demonstrated with a non-limiting example of subjecting a first COC substrate to an orogenic growth with cyclohexane, and immediately bonding a second COC substrate to the patterned surface of the first COC substrate. In this particular example, the first COC substrate has a channel height of 51 micrometers after a 60 minutes solvation treatment. After the bonding of the second substrate, the channel height surprisingly increases to 61 micrometers. A possible explanation for this phenomenon may be that the solvent absorbed by the swollen surface of the first substrate is in contact with the second substrate when the bonding takes place. The exposure of the thermoplastic to the solvent induces orogenic growth in the second substrate in the contacted areas only, increasing the channel wall height.

The extra growth of the channel wall height is not limited to particular thermoplastic material and solvent combinations. Any suitable pairs of thermoplastic material and solvent may demonstrate the extra growth by simply bonding together. The growth height depends on the combination of the thermoplastic and the solvent, as well as other solvation and bonding conditions. Some exemplary factors that may affect the growth height include, but are not limited to, the solubility of the thermoplastic polymer in the solvent, the time of solvation, the temperature of bonding, the time interval between the end of the orogenic growth and the bonding.

The bonding may be carried out under any temperature and pressure conditions, so long as the bonding strength is acceptable for its intended application. Without limiting the invention, the bonding is preferably carried out within a temperature range of −20° C.-120° C., more preferably within a temperature range of 0° C.-50° C., and even more preferably 15° C.-25° C. The range of 15° C.-25° C. is referred to as the room temperature. Without limiting the invention, the bonding is preferably carried out within a bonding pressure range of less than 5,000 psi, more preferably within a bonding pressure range of less than 1,000 psi, and even more preferably 500 psi. The bonding may be carried out at a bonding pressure of at least 10 psi.

In one embodiment of the current invention, the resulting bonding of the solvent bonding process may have a burst pressure of more than 10 MPa. In another embodiment of the current invention, the resulting bonding of the solvent bonding process may have a burst pressure of more than 15 MPa. Without limiting the current invention, a burst pressure for a bonding is preferably less than 500 MPa.

Without limiting the current invention, the method according to the first aspect of the invention may further comprise a step of forming a seal at an isolation member region within the device. The method for making the seal is not particularly limited. According to one embodiment of the first aspect of the current invention, the bonding between the first and second substrates at the isolation member region is performed by thermal bonding. According to another embodiment of the current invention, the seal within the fluidic device has a burst pressure that is lower than the burst pressure of the bonded first and second substrates. In this embodiment, fluid isolated by the seal may be release by applying a pressure that is higher than the burst pressure of the seal, but lower than the burst pressure of the bonded first and second substrates, to burst the seal, while the fluid is contained within the device.

The second aspect of the current invention provides a method for manufacturing devices, comprising: masking a substrate comprising a thermoplastic polymer; and exposing the masked substrate to a solvent so that the thermoplastic polymer exposed to the solvent swells and grows in height; wherein the masking step comprises probe deposition of a protective composition.

When preparing the substrate for the second aspect of the current invention, the geometry and dimensions of the substrate is particularly flexible. Without limiting the current invention, since the method of probe deposition of a protective composition is employed in the masking step, the substrate used in the second aspect of the current invention may have a non-planar surface. Some non-limiting examples of the non-planar surfaces compatible with the second aspect of this invention may include, but are not limited to, a curved surface, a ball surface and a substrate with existing three dimensional features and needs a second masking.

The third aspect of the current invention provides a device comprising at least a channel, manufactured with a method comprising: masking a first substrate of thermoplastic polymer with a masking method; exposing the masked first substrate to a solvent so that the thermoplastic polymer exposed to the solvent swells and grows in height, forming walls of the channel; and bonding the first substrate with a second substrate; wherein the bonding step comprises solvent bonding; and wherein a height of the channel wall is more than 1 nm but no more than 500 µm.

The height of the channel wall due to orogenic growth in the device according to the third aspect of the current invention is not particularly limited. The orogenic growth height depends on, among many other factors, the chemical properties of the thermoplastic polymer and solvent, the solvation time, and the bonding conditions. The height of the channel wall is preferably no less than 1 nanometer and no more than 500 micrometer, more preferably no less than 5 nanometers and no more than 200 micrometer, still more preferably no less than 10 nanometers and no more than 1000 nanometers, and yet still more preferably no less than 10 nanometers and no more than 200 nanometers. Although thermoplastic polymer growing more than 500 micrometers in height upon solvation may be achievable, structures like hillock protruding from the substrate increases as the wall height increases. The hillocks tend to collapse during the bonding step, causing undesirable clogs in the fluidic device. For orogenic growth of less than 1 nanometer, the channel height may be too small for any practical fluidic application.

Conventional methods of constructing fluidic devices with channels and/or chambers generate a problem of collapsing walls. During the bonding step, high temperature and high pressure leads to collapse of channel walls, causing clogs within the fluidic device. The collapse due to bonding pressure occurs with devices of all scales, but is particularly problematic in fluidic devices that have a dimension in the range of 10-100 nanometers, because even small piece of collapsed wall material may block the channel, disabling the whole device.

The device according to the third aspect of the current invention has an unexpected advantage as nanoscale channels. Channels of sub-micrometer scales in wall height can be made with short solvent exposures, while the channel wall maintains as a highly smooth surface. Without particularly limiting the current invention, the average surface roughness on the channel wall according to the third aspect of the current invention is preferably 5 nanometers or less, more preferably 3 nanometers or less. According to the third aspect of the current invention, the bonding step comprises a solvent bonding, which does not require high temperature and pressure. Also, because solvent is prevented from entering the masked regions on the first substrate patterned with orogenic features, solvent bonding is prevented from occurring within these patterned channel regions. As such, the device of the third aspect of the current invention is collapse free, which cannot be achieved through other fabrication method.

Another advantage offer by the third aspect of the current invention is that the bottom surfaces of the channels or chambers in the device constructed with orogenic process has maintained their physical/chemical properties such as mechanical strength, optical properties, surface polarity, etc. The bottoms of channels or chambers are usually utilized as ports for signal input/output due to their relatively larger surface area. Also, in some bio-micro-fluidic device, biomolecules or even cells exhibit unique preference to surfaces of certain properties. It is desirable that these bottom parts of the channels or chambers have stable physical/chemical properties. Conventional methods of processing thermoplastic polymers involve removing or replacing material from the bulk body, as discussed early. During the conventional processing, the bottom parts of the channels or chambers are in direct contact with chemical agents or mechanical forces. The physical/chemical properties of the bottom parts inevitably are altered in the conventional processing. With the orogenic process, the bottom parts of the channels or chambers are protected under the masking layer while the exposed areas of thermoplastic grow to form the walls of the channels or chambers. The physical properties of the bottom parts is maintained the same as the original thermoplastic material. As such, the device according to the third aspect of the current invention has the advantage of having stable physical properties on the bottom surface.

The structure of the device according to the third aspect of the current invention is not particularly limited. Structural units such as, but not limited to, channels and chambers may be arranged within the device. According to one embodiment of the current invention, a seal within the device as an isolating member may be formed to isolate fluid. Without limiting the current invention, the seal has a burst pressure that is lower than the burst pressure of the bonded first and second substrates. The fluid isolated by the seal may be released upon application of a pressure that is higher than the burst pressure of the seal, but lower than the burst pressure of the bonded first and second substrates.

WORKING EXAMPLES

Example 1

Orogenic Growth Rate Using COC and Cyclohexane

COC plates were cut into 2 square-inch chips which were deburred to remove machining debris from the chip edges. The chips were sequentially sonicated in methanol, 2-propanol, and de-ionized water for 5 min, and then degassed overnight at 60° C. under vacuum. Shipley 1813 positive photoresist was spin-coated on the polymer chip surface to a thickness of approximately 1.5 µm, and patterned by contact photolithography through a chromium-coated glass plate mask using a UV flood exposure tool (PRX1000; Tamarack Scientific, Corona, Calif.). After exposure and photoresist development, the chips were rinsed with DI water, blown to dry with N2, and baked on a 60° C. hot plate for at least 8 h to dehydrate the thermoplastic and densify the patterned photoresist, which was directly used as a masking layer. Lines and spaces of varying width were patterned in a photoresist layer deposited on a set of COC chips, followed by timed vapor-phase exposure to the cyclohexane solvent. \

Figure 1:
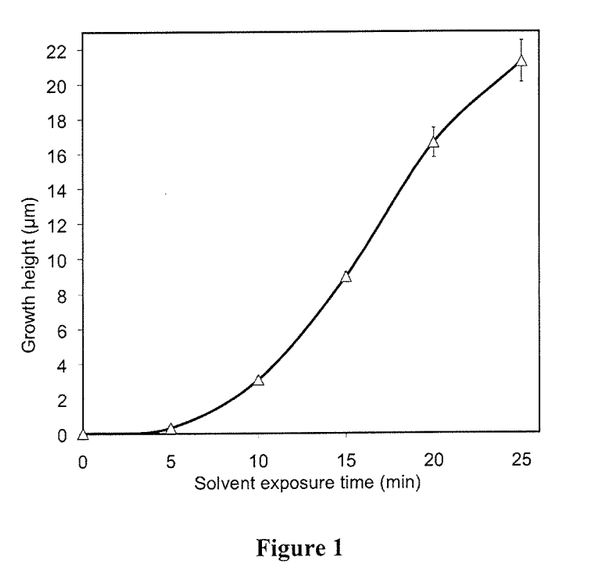
FIG. 1 is a plot reflecting the relationship between COC surface growth height and solvent vapor exposure time.

FIG. 1 shows that growth heights of COC/cyclohexane system against the exposure time. With exposure times below 5 min, submicron growth heights are achievable. For solvation times between 5-25 min, a nearly constant growth rate consistent with case II diffusion was observed. Significantly longer solvent exposure times between 25-60 min (not shown), the growth rate was slightly reduced, with an average growth height of 51 µm achieved for the maximum tested exposure time of 60 min. These results were highly repeatable across multiple chips (n=5), with less than 10% variation in growth heights for all repeated experiments.

Example 2

Comparison of Effects of Different Masking Methods in Orogenic Process

FIGS. 2(a)-(f) compare the effects on orogenic growth with photolithography, UV/$O_3$ masking, glycerol microcontact printing, and glycerol noncontact spotting.

For the UV/$O_3$ masking method, Following photolithography, COC chips were loaded into a commercial UV/$O_3$ exposure system and subjected to a 30 min exposure. After UV/$O_3$ treatment, the polymer chips were submerged in methanol and sonicated for 1 min to remove photoresist, rinsed sequentially by 2-propanol and DI water, and dried at room temperature under a stream of $N_2$.

For glycerol patterning, a PDMS layer with 200 micrometer diameter circular posts was fabricated as an elastomer stamp in the microcontact printing. Glycerol was spin-coated onto a silicon wafer to a thickness of approximately 5 µm, and the PDMS stamp was pressed into the thin layer of glycerol and applied to the COC chip surface manually to transfer the patterned glycerol film. For masking by non-contact spotting, a single hair strand was dipped in glycerol and dragged along the COC chip surface to deposit discrete droplets with a distribution of diameters ranging from several microns to several hundred microns. Droplet diameters were measured optically prior to solvent exposure and post-exposure electron microscopy.

Figure 2:
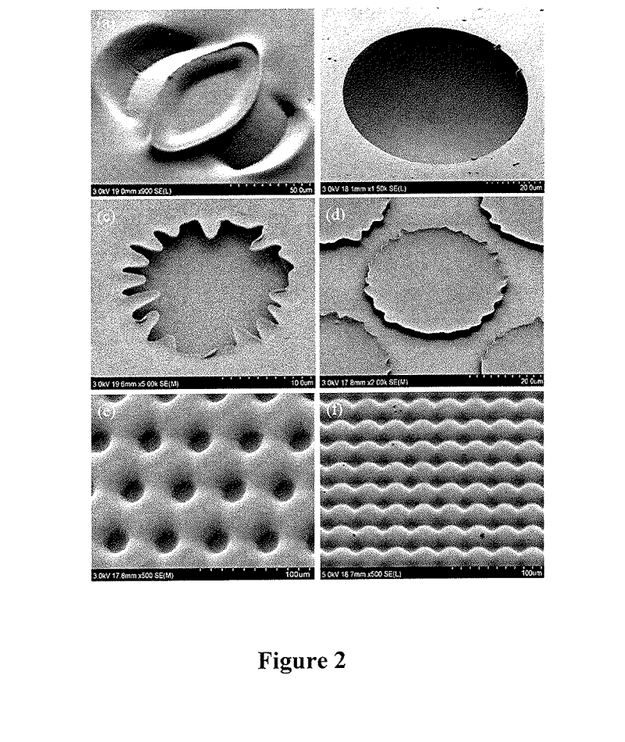
FIG. 2 compares orogenic features patterned in COC substrate using different masking techniques: (a) glycerol microcontact printing; (b) glycerol spotting; (c) and (d) photoresist masking; and (e) and (f) UV/$O_3$ masking.

FIG. 2(a) shows the orogenic processing result with the microcontact printing masking using glycerol as the masking layer; FIG. 2(b) shows the orogenic processing result with the noncontact spotting using glycerol as the masking layer; FIGS. 5(c) and 5(d) show orogenic processing result with light field and dark field photoresist masking, respectively. FIGS. 5(e) and 5(f) shows orogenic processing result with similar light and dark field features patterned by UV/$O_3$ masking.

Example 3

Inkjet Printing

Inkjet printing was performed using a flatbed direct-to-substrate desktop printer (Direct Color Systems, Rocky Hill, Conn.) employing an Epson piezoelectric print head, with a proprietary ink based on a mixture of propyl glycol monomethyl ether and 2-butyl ethanol as a carrier.

The use of an oil-based ink was dictated by the moderate hydrophobicity of common thermoplastics including COC, requiring a non-aqueous carrier to prevent the ink from beading on the polymer surface and losing printing resolution before drying. After orogenic growth, the ink is easily removed from the chip surface by brief sonication in water.

Figure 3:
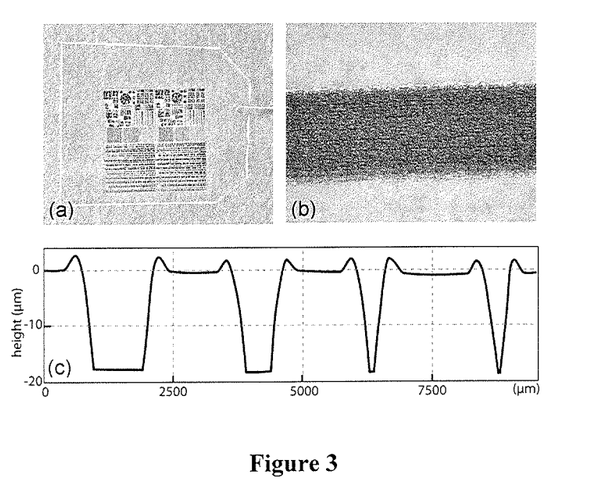
FIG. 3 illustrates the results of orogenic feature with inkjet masking: (a) overall image of an inkjet printed substrate; (b) micrograph of a 400 μm line; and (c) profilometry measurement of orogenic features (100-400 um wide) generated with inkject masking.

FIG. 3(a) is an image of a thin COC foil containing an inkjet printed mask design. FIG. 3(b) is a micrograph of a 400 μm wide ink line on the COC foil surface. FIG. 3(c) illustrates a profilometry measurement of the COC substrate masked with inkjet printed line features ranging in width from 100 μm to 400 μm, and exposed to solvent for 15 min.

Example 4

Probe Deposition of a Protective Composition

COC chips were diced to the desired size and sequentially cleaned by methanol, isopropanol, and DI water, followed by N2 drying and overnight degassing at 75° C. under vacuum.

Ink from a wet-erase marker cartridge is used with a high resolution pen nib for selective masking. Patterns of lines with various widths are directly drawn onto a COC chip. For precise patterning, a 3-axis desktop CNC milling machine (MDX-650, Roland DGA, Irvine, Calif.) has been modified with a penholder, allowing direct and automated transfer of a computer-generated mask layout to the COC chip.

Solvent exposure is conducted in the same way as described in preceding examples. After exposure to solvent vapor for the desired time, the COC chip is promptly removed from the solvent dish and brought into aligned contact with a mating COC sealing layer. Each multilayer chip assembly is then bonded by either using a hot press (AutoFour/15, Carver, Wabash, Ind.) at a pressure of 500 psi or by running the chip through a desktop laminator (model PL1200, NSC International, Hot Springs, Ark.) to apply consistent moderate pressure to the mating surfaces, resulting in a permanent solvent bond between the layers. In both methods, bonding is performed at room temperature. Before bonding, fluidic access ports were milled in the COC sealing chip using a 125 μm diameter end mill. For completed microfluidic chips, interfacing between the access ports and off-chip syringe pumps was realized by inserting needle tubing segments (Hamilton Syringe, Reno, Nev.) into the access ports following a previously-reported method.

Figure 4:
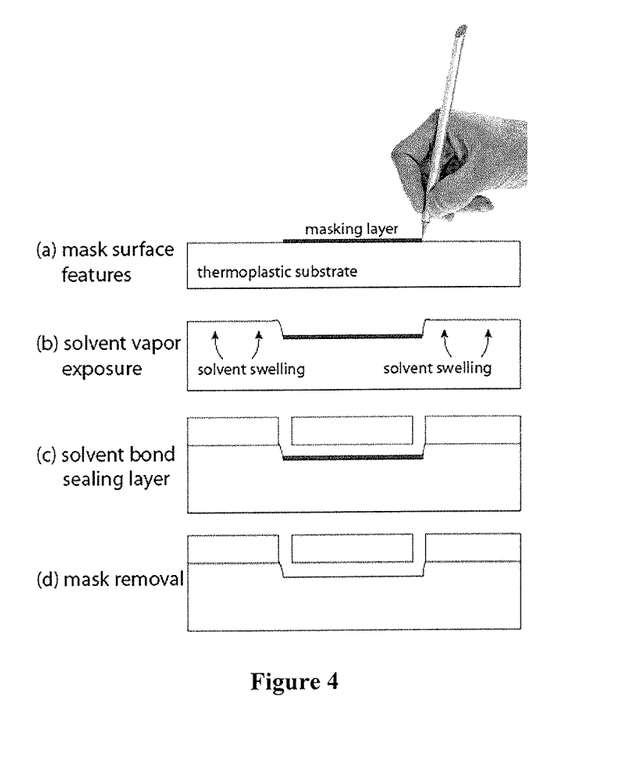
FIG. 4 reflects an overview of the pen microfluidics fabrication process.

The basic process of producing sealed microchannels by orogenic microfabrication process is illustrated in FIG. 4. Depending on the desired channel height, the entire process from mask patterning to sealed chip is typically completed within 30-90 min.

Figure 5:
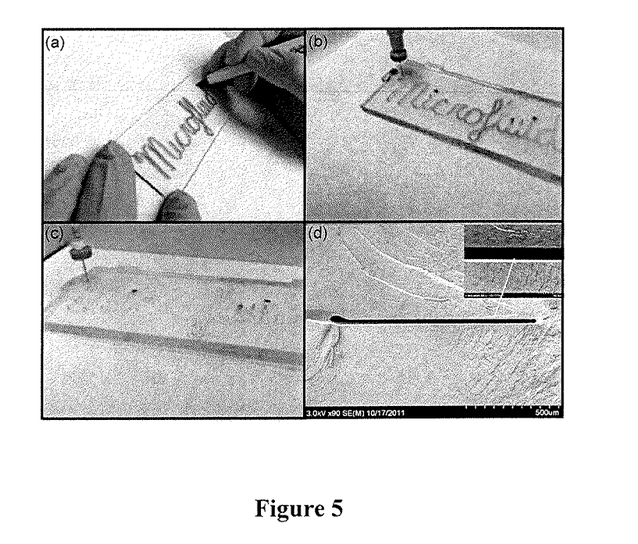
FIG. 5 shows a micro-channels fabricated with orogenic process using manual probe deposition method.

The dimensions of microchannels fabricated in the orogenic process are limited by the pen nib dimensions. Masking linewidths slightly below 1 mm can be made with commercially available pen nib by manual writing, as illustrated in FIG. 5(a). After drawing the ink mask, exposing the chip to solvent vapor for 15 min, and sealing the channel, the water-soluble ink was removed by flushing the channels with DI water (FIG. 5(b)) followed by injection of red food coloring (FIG. 5(c)) to demonstrate that the channels remain open throughout the process.

Figure 6:
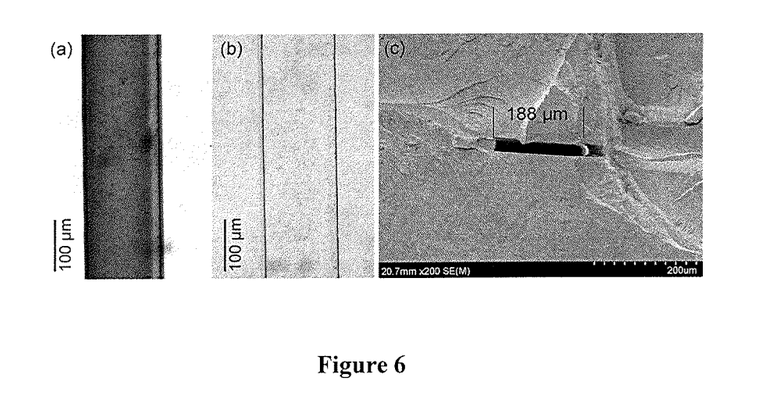
FIG. 6 shows bright field images of a microchannel formed in a COC substrate by orogenic growth with a manually-drawn ink mask.

Experiments using a refillable fiber-tip marker of a reported 200 μm nib diameter were carried out with the same ink composition as discussed above, with the resulting microchannel shown in FIG. 6.

For the channels shown in FIG. 5d and FIG. 6, chip bonding was performed using a hot press after 15 min orogenic growth, resulting in an average channel height of 22 μm in each case. It was established in Example 1 that with a system of COC/cyclohexane, 60 min exposures yields an average growth height of 51 μm, with nearly linear growth between 5-60 min.

However, a region of piled-up polymer forms at these boundaries, resulting in localized hillocks of polymer that typically protrude out of the plane of the chip by 40-50% of the overall growth height. Because these raised hillocks act as stress so concentration points during chip bonding, application of a high bonding force during channel sealing serves to deform the solvated hillocks, forcing polymer from the raised regions to flow into the open microchannels. In the case of high pressure bonding using a hot press, this polymer reflow results in nearly vertical sidewalls as the hillock volume is displaced into the open channel. This phenomenon can be clearly seen in FIG. 5(c).

Example 5

Bonding with Substrate Processed with Orogenic Technique

Figure 7:
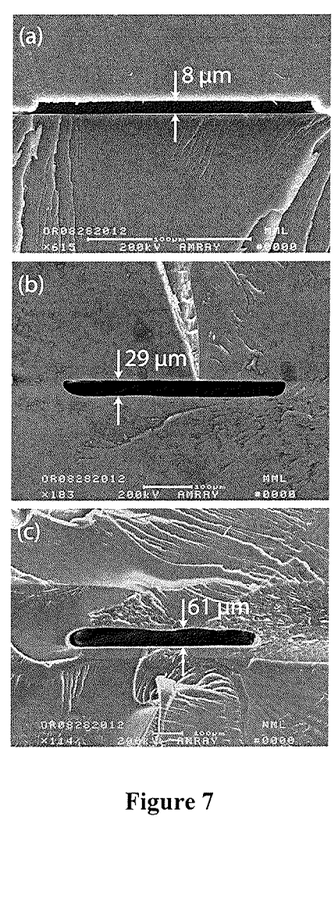
FIG. 7 shows the cross-sectional views of channels fabricated using various solvent exposure times.

Examples of channels fabricated using different solvent exposure times and bonding methods are presented in FIG. 7. It is significant that final channel heights are higher than previously reported orogenic growth heights alone. For example, in the case of a 15 minute solvent exposure time, leading to an orogenic growth height of 17 μm, a final channel height of 22 μm is observed (e.g. FIG. 6). Similarly, a 60 min exposure expected to yield a 51 μm growth height results in a channel height of 61 μm (FIG. 7c). The enhanced channel height is believed to be largely due to the presence of the solvent-swollen polymer hillocks at the mask edge following orogenic growth. A further factor that may contribute to the increased channel height is that solvent absorbed by the orogenically-patterned chip can transfer into the sealing layer during the bonding process, leading to swelling and additional growth of the sealing layer where the chips are in contact. Regardless of the solvent exposure time and bonding method, the final sealing interface is highly planar, with good sealing in the field far from the channels. Bonding strength of the final sealed chips is excellent, with typical burst pressures above 15 MPa as measured using a liquid chromatography pump connected to the chips through high pressure needle ports.

While not demonstrated in this study, we also note that the orogenic fabrication method may be used for the formation of channels with sub-micrometer scale heights by reducing solvent exposure time. Short solvent exposure times below 5 min are able to produce consistent and controllable growth heights below 200 nm, while maintaining a highly smooth polymer surface with average surface roughness below 3 nm. This approach offers a facile alternative to current methods for two-dimensional nanofluidic device fabrication, since the absence of solvent within the channel regions prevents nanochannel collapse during bonding.

What is claimed is:

1. A method for manufacturing devices, comprising:
    masking a first substrate comprising a thermoplastic polymer;
    forming a channel by exposing the masked first substrate to a solvent so that the thermoplastic polymer exposed to the solvent swells and grows in height forming walls of the channel around the masked area; and
    bonding the first substrate with a second substrate such that the channel is formed between the first and second substrate.

2. The method for manufacturing devices according to claim 1, wherein the thermoplastic polymer comprises a cyclic olefin polymer and/or a cyclic olefin copolymer.

3. The method for manufacturing devices according to claim 2, wherein
the cyclic olefin copolymer comprises a product of chain copolymerization of one or more cyclic hydrocarbon monomers with an alkene.

4. The method for manufacturing devices according to claim 3, wherein
at least one cyclic hydrocarbon monomer contains at least one ring, has 3-25 carbon atoms, and optionally has one or more side chains.

5. The method for manufacturing devices according to claim 4, wherein
the cyclic hydrocarbon monomer is at least one of norbornene or tetracyclododecane.

6. The method for manufacturing devices according to claim 3, wherein
the alkene has a branched or straight chain and contains 2-12 carbon atoms.

7. The method for manufacturing devices according to claim 6, wherein
the alkene comprises ethene.

8. The method for manufacturing devices according to claim 1, wherein
the solvent has a solubility parameter that differs from a solubility parameter of the thermoplastic polymer by more than 1% and no more than 8%.

9. The method for manufacturing devices according to claim 8, wherein
the solvent has a solubility parameter that differs from a solubility parameter of the thermoplastic polymer by more than 4% and no more than 6%.

10. The method for manufacturing devices according to claim 2, wherein
the solvent comprises cyclohexane.

11. The method for manufacturing devices according to claim 1, wherein
the masking step comprises at least one method selected from the group consisting of photolithography, UV/$O_3$ masking, contact printing, inkjet printing and probe deposition of a protective composition.

12. The method for manufacturing devices according to claim 1, wherein
the second substrate comprises a thermoplastic polymer with a solubility parameter that differs from the solubility parameter of the solvent by more than 4% and no more than 6%.

13. The method for manufacturing devices according to claim 1, wherein
the second substrate comprises the same thermoplastic polymer as the thermoplastic polymer of the first substrate.

14. The method for manufacturing devices according to claim 2, wherein
the second substrate comprises cyclic olefin copolymer.

15. The method for manufacturing devices according to claim 12, wherein
the bonding step comprises solvent bonding.

16. The method for manufacturing devices according to claim 15, wherein
the bonding step is carried out at room temperature.

17. The method for manufacturing devices according to claim 15, wherein
the bonding step is carried out under a pressure of no more than 500 psi.

18. The method for manufacturing devices according to claim 15, wherein a burst pressure for the channel formed by the bonding between the first and second substrates is more than 10 MPa.

19. The method for manufacturing devices according to claim 15, wherein a burst pressure for the channel formed by the bonded first and second substrates is more than 15 MPa.

20. The method for manufacturing devices according to claim 15, further comprising:
forming a seal at an isolation member region within the device, wherein a burst pressure of the channel formed by the bonded first and second substrates is lower at a point at the seal than the burst pressure of the bonded first and second substrates at a point not at the seal.

21. The method for manufacturing devices according to claim 20, wherein bonding between the first and second substrates at the isolation member region is performed by thermal bonding.

* * * * *